United States Patent
Egitto et al.

(10) Patent No.: US 7,292,055 B2
(45) Date of Patent: Nov. 6, 2007

(54) INTERPOSER FOR USE WITH TEST APPARATUS

(75) Inventors: Frank D. Egitto, Binghamton, NY (US); How T. Lin, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/110,901

(22) Filed: Apr. 21, 2005

(65) Prior Publication Data

US 2006/0238207 A1  Oct. 26, 2006

(51) Int. Cl.
*G01R 31/02* (2006.01)

(52) U.S. Cl. .............. 324/754; 324/757; 324/761
(58) Field of Classification Search .............. None
See application file for complete search history.

(56) References Cited

U.S. PATENT DOCUMENTS

| | | |
|---|---|---|
| 4,105,970 A | 8/1978 | Katz |
| 5,207,585 A | 5/1993 | Byrnes et al. |
| 5,391,995 A | 2/1995 | Johnston et al. |
| 5,528,159 A | 6/1996 | Charlton et al. |
| 5,641,945 A | 6/1997 | Abe et al. |
| 5,880,590 A | 3/1999 | Desai et al. |
| 5,953,816 A * | 9/1999 | Pai et al. .............. 29/879 |
| 6,051,982 A | 4/2000 | Alcoe et al. |
| 6,156,484 A | 12/2000 | Bassous et al. |
| 6,309,915 B1 | 10/2001 | Distefano |
| 6,333,563 B1 | 12/2001 | Jackson et al. |
| 6,383,005 B2 | 5/2002 | Ho et al. |
| 6,414,248 B1 * | 7/2002 | Sundstrom ............. 174/260 |
| 6,477,034 B1 * | 11/2002 | Chakravorty et al. .... 361/306.3 |
| 6,529,022 B2 | 3/2003 | Pierce |
| 6,671,947 B2 * | 1/2004 | Bohr .................... 29/846 |
| 6,816,385 B1 | 11/2004 | Alcoe |
| 6,828,510 B1 | 12/2004 | Asai et al. |
| 6,881,072 B2 * | 4/2005 | Egitto et al. .............. 439/67 |
| 6,904,674 B2 * | 6/2005 | Mune et al. ............. 29/852 |
| 6,916,181 B2 * | 7/2005 | Brown et al. ............ 439/66 |
| 6,970,005 B2 * | 11/2005 | Rincon et al. ........... 324/754 |
| 7,154,046 B2 * | 12/2006 | Chung ................... 174/259 |
| 2004/0178492 A1* | 9/2004 | Tsukamoto et al. ....... 257/690 |
| 2004/0198033 A1* | 10/2004 | Lee et al. ............... 438/613 |

* cited by examiner

*Primary Examiner*—Minh N. Tang
(74) *Attorney, Agent, or Firm*—Hinman, Howard & Kattell, LLP; Lawrence R. Fraley

(57) ABSTRACT

An interposer including at least two dielectric layers bonded to each other, sandwiching a plurality of conductors therebetween. The conductors each electrically couple a respective pair of opposed electrical contacts formed within and protruding from openings with the dielectric layers.

9 Claims, 6 Drawing Sheets

INTERPOSER FOR USE WITH TEST APPARATUS

TECHNICAL FIELD

The invention relates to interposers, and particularly to interposers for use with test apparatus for testing electronic components, one particular example being a semiconductor device (chip) used in such electronic components as high density electronic packaging structures, including those eventually used in information handling systems such as personal computers, servers, etc. More particularly, the invention relates to test apparatus interposers for successfully being coupled to extremely small conductive elements such as solder ball arrays which are often used in combination with (as part of) such electronic components.

BACKGROUND OF THE INVENTION

Miniaturization is a main objective of many of today's electronic component developers and manufacturers, especially those who design and develop semiconductor chips. Today's chips contain many times the number of connections of chips of just a few years ago, and further miniaturization efforts are ongoing. Accordingly, developers of various electronic packages (e.g., chip carriers) and printed circuit boards (or cards) have been similarly pressed to provide higher density connections to accommodate the chip or chips designed for being mounted thereon and electrically coupled thereto.

Typically, such chips and corresponding electronic packages utilize extremely small conductive members such as spherically-shaped solder balls as the connecting medium. Such solder balls may possess a diameter of only about 0.003 inch to about 0.006 inch, and in the final product for incorporation within a larger electronic structure (e.g., a microprocessor), are typically arranged in compact, highly dense arrays (e.g., those with the balls positioned apart on only 0.006 inch centers). The electrical circuitry for such packages is also highly dense, and may possess line widths as small as about 0.002 inch, with 0.002 inch spacing between lines. Even smaller elements are presently being contemplated for future products.

It is readily understood that testing of such devices, packages, and the like is a critical and necessary step during the manufacture thereof, in order to prevent subsequent failure when the chip and its corresponding package and associated printed circuit board are utilized in a larger (and often very expensive) assembly such as a microprocessor (e.g., computer server or mainframe). It can also be appreciated that such testing can be a difficult, complex and time-consuming operation.

Examples of various printed circuit board (substrate) structures as well as means for testing electronic structures are illustrated in the following U.S. Letters Patents.

In U.S. Pat. No. 6,828,510, entitled "Multilayered Printed Wiring Board And Method Of Manufacturing Multilayered Printed Wiring Board", issued Dec. 7, 2004, there is described a multilayered board structure in which a "core" substrate is formed having a metal layer sandwiched between two dielectric layers. Plated through holes (PTHs) are formed in the dielectric layers using lasers and the interim conductor, being metal, apparently helps to determine the hole depth. A specific bismaleimide-triazine (BT) resin (called "refractory" in one embodiment in the patent) is used, which, according to this patent, includes soluble particles dispersed therein. An "interlayer" resin insulating layer is built up on the "core" substrate. Immersion in electro-less plating solution is described as a means for plating the PTH side walls.

In U.S. Pat. No. 6,816,385, entitled "Compliant Laminate Connector", issued Nov. 9, 2004, there is described a flexible shear-compliant laminate connector having a plurality of contacts formed on a first surface and second surface of the connector, wherein select contacts on the first surface of the connector are off-set from select contacts on the second surface of the connector. The laminate includes a core comprising copper-invar-copper (CIC), or other similarly used material, such as copper, stainless steel, nickel, iron, molybdenum, etc. The core has a thickness in the range of approximately 1-3 mils. The choice of core material depends upon the material within the chip package being attached thereto. For a ceramic chip package, having a relatively low CTE, the overall CTE of the laminate may be about midway between the card and the chip package. According to this patent, this provides improved distribution of stress, and therefore a reduction of stresses within the BGA connections and the interconnection.

In U.S. Pat. No. 6,529,022, entitled "Wafer testing interposer for a conventional package", issued Mar. 4, 2003, there is described a wafer testing interposer. The interposer comprises a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch that the first electrical terminals, and these are located within the pattern formed by the first electrical terminals. One or more second electrical pathways connect the first electrical pathways to the second electrical pathways.

In U.S. Pat. No. 6,383,005, entitled "Integrated circuit socket with contact pad", issued May 7, 2002, there is described an integrated circuit socket having a contact pad. The integrated circuit socket includes a base unit, consisting of a base, contact pins and an elastomer. The contact pins provide electrical contact of the other elements and the elastomer provides the compactness of the assembly. The socket further includes an interposer, consisting of a flexible film, a stiffener and a stop layer wherein the contact pad of the flexible film may contact with the solder ball of the IC device to buffer the pressure formed by a tight contact when the IC device is moving downward. The socket also consists of an adapter unit and a cover.

In U.S. Pat. No. 6,333,563, entitled "Electrical interconnection package and method thereof", issued Dec. 25, 2001, there is described an electrical interconnection package and a method for using same which allegedly increases the fatigue life of a Ball Grid Array (BGA) electrical interconnection. (Such BGAs include, understandably, solder balls of the type mentioned above, and interconnect components of the type also mentioned above.). This described structure includes an organic interposer using a high modulus underfill material to couple an electronic "module." The organic interposer is then joined to an organic board (PCB) using standard joining processes. The "module" can be removed from the organic board at any time by removing the organic interposer using standard rework techniques.

In U.S. Pat. No. 6,309,915, entitled "Semiconductor chip package with expander ring and method of making same", issued Oct. 30, 2001, there is described a method of making a semiconductor chip assembly, including providing a dielectric element with a plurality of electrically conductive terminals, disposing an expander ring over the dielectric element so that a semiconductor chip on the dielectric layer is disposed in a central opening in the expander ring, and disposing an encapsulant in the gap between the expander ring and the semiconductor chip. The size of the gap is controlled to minimize the pressure exerted on the leads by the elastomer as it expands and contracts in response to changes in temperature. The semiconductor chip and expander ring may also be connected to a heat sink or thermal spreader with a compliant adhesive.

In U.S. Pat. No. 6,156,484, entitled "Gray Scale Etching For Thin Flexible Interposer, issued Dec. 5, 2000, there is described a sculpted probe pad and a gray scale etching process for making arrays of such probe pads on a thin flexible interposer for testing the electrical integrity of microelectronic devices at terminal metallurgy. Also used in the etching process is a fixture for holding the substrate and a mask for single step photolithographic exposure. The result is an array of test probes of pre-selected uniform topography, which make contact at all points to be tested simultaneously and nondestructively. The pad is retained within a dielectric body and includes a "domed" portion and an opposing "sculpted" portion which is formed using etching, resulting in "features" having "sculpted" areas. Both portions are part of an integral structure, such that these are of a single metallic body and arranged in an opposing orientation with one portion being directly opposite the other.

In U.S. Pat. No. 6,051,982, entitled "Electronic component test apparatus with rotational probe and conductive spaced apart means", issued Apr. 20, 2000, there is described a test apparatus including at least one probe member precisely aligned using two spaced apart means (e.g., thin layers) such that the probe can effectively engage a conductor (e.g., solder ball) on an electronic module (e.g., ball grid array package). A compressible member (e.g., elastomeric body) is used to bias the probe toward the conductor. Various probe cross-sectional configurations are also provided. As taught herein, the probe electrically contacts one of the spaced apart means, also conductive, to thus form a circuit which can extend externally of the apparatus (e.g., for connecting to appropriate testing equipment).

In U.S. Pat. No. 5,880,590, entitled "Apparatus and method for burn-in and testing of devices with solder bumps or preforms", issued Mar. 9, 1999, there is described an apparatus for providing temporary connections to a flip-chip style chip having solder bumps or pre-forms protruding there-from for testing and burn-in while avoiding distortion of the bumps or pre-forms and avoiding wear and damage to a test or burn-in jig such as a ball grid array. The apparatus uses a resilient bucketed interposer which includes recesses which have a depth greater than the protrusion of the solder bumps or pre-forms and, preferably are narrowed at one side to a tear-drop shape. Metallization in the recesses and contacts on the interposer which mate with the jig are preferably textured with dendrites to be self-cleaning. A beveled tongue and groove arrangement translates a slight compressive force to a slight shearing force between the interposer and the chip to ensure good connections to the protruding solder bumps on the chip. Any deformation of the bumps thus tends to only improve accuracy of positioning of the bumps and avoids solder voiding due to compression distortion. Full burn-in and functional testing can then identify "known good" chips or dies before package completion, particularly to avoid rework of modular circuit packages.

In U.S. Pat. No. 5,641,945, entitled "Contacting structure with respect to spherical bump", issued Jun. 24, 1997, there is described a contacting structure with respect to a spherical bump in which the spherical bump is to be contacted with a contact pin, the contact pin including a contacting portion supported by a resilient support element. The contacting portion is arranged in opposite relation to that part of a spherical surface of the spherical bump other than a lowermost point thereof. The contacting portion has a projection capable of pressing into the spherical surface of the spherical bump, and also has a pressure receiving surface for setting an amount by which the projection presses into the spherical surface.

In U.S. Pat. No. 5,528,159, entitled "Method and apparatus for testing integrated circuit chips", issued Jun. 18, 1996, there is described a method and apparatus for testing semi-conductor chips which include Input/Output (I/O) contacts. The apparatus is provided with an interposer that has contacts corresponding to the contacts on the semiconductor chip. Both the chip and the interposer contacts can be any known type including metal ball, bumps, or tabs or may be provided with dendritic surfaces. The chip contacts are first brought into relatively loose temporary contact with the contacts on the interposer and then a compressive force greater that 5 grams per chip contact is applied to the chip to force the chip contacts into good electrical contact with the interposer contacts. Testing of the chip is then performed. The tests may include heating of the chip as well as the application of signals to the chip contacts. After testing, the chip is removed from the substrate.

In U.S. Pat. No. 5,391,995, entitled "Twisting electrical test probe with controlled pointing accuracy (Johnston), issued Feb. 21, 1995, there is described a spring biased test probe for testing electrical printed circuit boards which includes an elongated tubular barrel having an open end, and a compression spring within a spring seating end of the barrel, opposite from its open end. A plunger inserted in the barrel reciprocates during testing, sliding within the barrel and biased by the spring pressure. The plunger includes a forward end portion outside the barrel, a slidable tail portion that contacts the spring and slides within a barrel, and an intermediate twisted portion between the forward end and the tail portion of the plunger. The forward end of the plunger has a probe tip configured to make frictional pressure contact with the board to be tested. The intermediate portion is twisted about its axis to form a spiral with helical grooves contacted by circumferentially spaced apart crimps in the side of the barrel, adjacent the open end of the barrel. The plunger is rotated about its axis by its contact with the crimps as the plunger travels axially in the barrel. The twisted intermediate section of the plunger and the forward end of the plunger extend outside the barrel which is contained in an elongated tubular outer receptacle. The forward end of the plunger includes an elongated enlarged diameter guide bearing section between the probe tip and the twisted section of the plunger.

In U.S. Pat. No. 5,207,585, entitled "Thin Interface Pellicle For Dense Arrays Of Electrical Interconnects", issued May 4, 1993, there is described a thin interface pellicle probe for making temporary or permanent interconnections to pads or bumps on a semiconductor device wherein the pads or bumps may be arranged in high density patterns. The electrode for each pad or bump has a raised portion for penetrating the surface of the pad or bump to create side-walls to provide a clean contact surface. The electrode also has a recessed surface to limit the penetration of the raised portion. The electrodes may be affixed to a thin flexible membrane to permit each contact to have independent movement over a limited distance and of a limited rotation. In one embodiment (FIG. 22), the electrode's opposing ends are offset from one another to permit the electrode to "rotate" slightly when force is applied, resulting in a desired wiping engagement.

In U.S. Pat. No. 4,105,970, entitled "Test Pin", issued Aug. 8, 1978, there is described an electrical testing pin characterized by a crown with an inner contact area and a plurality of outer contact areas, the former extending longitudinally beyond the latter. The pin includes a crown with a multiplicity of spaced sharp contacts including a central sharp contact and a multiplicity of sharp contacts spaced there-around in a contact set, each contact of the set being separated from adjacent contacts by continuous radial grooves extending uninterruptedly at an angle to define two of the sharp contacts of the set and also to allow for self-cleaning.

When simultaneously testing pluralities of conductive members such as the above-described extremely small solder balls arranged in a highly dense array, it is quickly understood that precise alignment of each test probe member is critical, especially during periods of force application. To establish electrical connection between the conductive members and the solder balls, it is necessary to provide sufficient force to penetrate the non-conductive metal (e.g., tin) oxide coating on the surface of the solder balls. It is further understood that excessive application of such forces can damage or even destroy the relatively delicate solder balls such that it is not possible to re-establish their spherical shape, even with attempts to reflow the balls at temperatures above the melting point of the solder. In addition, excessive application of such forces can either exceed the capability of the tester, cause deformation of the wafer, or cause damage to the integrated circuit device. Clearly, these probes must maintain a spaced relationship from one another (or shorting can occur during test), and must also allow ease of movement of the individual probes toward and away from the object being tested. It is critically important that these probes do so during periods of force application in which the forces may become somewhat excessive, to the point that if compensation does not occur, solder ball damage or even destruction may result. It is not believed that the test apparatus described in the above patents (or the substrates also described in some) are able to provide such connection and movement in an effective and cost-efficient manner capable of meeting many of today's demanding production schedules.

It is believed, therefore, that a test apparatus interposer capable of effectively interconnecting highly dense arrays of conductive members such as small diameter solder balls in a precise, yet expedient manner such as taught herein, would constitute a significant advancement in the art. It is particularly believed that an interposer capable of being used with such apparatus which allows for the formation of extremely dense arrays of interconnecting thru-holes therein will constitute an especially significant advancement in this art.

OBJECTS AND SUMMARY OF THE INVENTION

It is, therefore, a primary object of the present invention to enhance the electrical test art and particularly that portion of the art dedicated to testing highly dense conductor arrays on such electronic components as semiconductor chips, chip carriers, etc.

It is another object of the invention to provide an interposer adapted for being used in conjunction with such a test apparatus which maintains highly precise alignment between the apparatus contact members and the conductors being contacted as part of such testing.

It is yet another object of the invention to provide such an interposer which can be operated in a facile manner with such a test apparatus and which is relatively inexpensive to manufacture.

It is a still further object of the invention to provide an interposer comprised of a thin dielectric layer and associated contacts which is capable of being precisely oriented with respect to the component(s) being tested and thereafter easily removed or separated from the component so that the component can then be successfully utilized as desired, e.g., as part of a chip carrier.

It is another object to provide a method of making such an interposer which can be carried out in a relatively expeditious manner without the need for relatively complex equipment or complicated and expensive procedures.

According to one aspect of the invention, there is provided an interposer for use as part of a test apparatus for testing semiconductor chips having a plurality of contacts thereon, the interposer comprising a first dielectric layer including a plurality of openings therein, a first plurality of metallic contacts located within the plurality of openings within the first dielectric layer and adapted for engaging respective ones of a plurality of contacts of a semiconductor chip, selected ones of the first plurality of metallic contacts including a protruding portion protruding from the first dielectric layer, a second dielectric layer bonded to the first dielectric layer and including a plurality of openings therein, a second plurality of metallic contacts located within the plurality of openings within the second dielectric layer, selected ones of these second plurality of metallic contacts including a protruding portion protruding from the second dielectric layer in an opposite direction from the first plurality of metallic contacts protruding from the first dielectric layer, and a plurality of electrical conductors positioned substantially between the first and second dielectric layers, each of these electrical conductors electrically connecting selected ones of the first plurality of metallic contacts with respective ones of the second plurality of metallic contacts.

According to another aspect of the invention, there is provided a method of making an interposer for use as part of a test apparatus for testing semiconductor chips having a plurality of contacts thereon, the method comprising providing a first dielectric layer, positioning a first conductor layer on the first dielectric layer, forming a plurality of openings within the first dielectric layer, forming a first plurality of metallic contacts within the plurality of openings within the first dielectric layer and adapted for engaging respective ones of a plurality of contacts of a semiconductor chip, selected ones of the first plurality of metallic contacts including a protruding portion protruding from the first dielectric layer, forming a plurality of electrical conductors from the first conductor layer, positioning a second dielectric layer on the first dielectric layer and substantially over the plurality of electrical conductors, forming a plurality of openings within the second dielectric layer, and forming a second plurality of metallic contacts within the plurality of openings within the second dielectric layer, selected ones of the second plurality of metallic contacts including a protruding portion protruding from the second dielectric layer in an opposing direction from the first plurality of metallic contacts protruding from the first dielectric layer, selected ones of the plurality of electrical conductors electrically connecting selected ones of the first plurality of metallic contacts with respective ones of the selected ones of the second plurality of metallic contacts.

According to yet another aspect of the invention, there is provided an interposer comprising a first dielectric layer including a plurality of openings therein, a first plurality of metallic contacts located within the plurality of openings within the first dielectric layer, selected ones of the first plurality of metallic contacts including a protruding portion protruding from the first dielectric layer, a second dielectric layer bonded to the first dielectric layer and including a plurality of openings therein, a second plurality of metallic contacts located within the plurality of openings within the second dielectric layer, selected ones of these second plurality of metallic contacts including a protruding portion protruding from the second dielectric layer in an opposing direction from the first plurality of metallic contacts protruding from the first dielectric layer, and a plurality of electrical conductors positioned substantially between the first and second dielectric layers, each of these electrical conductors electrically connecting selected ones of the first plurality of metallic contacts with respective ones of the second plurality of metallic contacts.

According to a still further aspect of the invention, there is provided a method of making an interposer comprising providing a first dielectric layer, positioning a first conductor layer on the first dielectric layer, forming a plurality of openings within the first dielectric layer, forming a first plurality of metallic contacts within the plurality of openings within the first dielectric layer, selected ones of the first plurality of metallic contacts including a protruding portion protruding from the first dielectric layer, forming a plurality of electrical conductors from the first conductor layer, positioning a second dielectric layer on the first dielectric layer and substantially over the plurality of electrical conductors, forming a plurality of openings within the second dielectric layer, and forming a second plurality of metallic contacts within the plurality of openings within the second dielectric layer, selected ones of the second plurality of metallic contacts including a protruding portion protruding from the second dielectric layer in an opposing direction from the first plurality of metallic contacts protruding from the first dielectric layer, selected ones of the plurality of electrical conductors electrically connecting selected ones of the first plurality of metallic contacts with respective ones of the selected ones of the second plurality of metallic contacts.

BEST MODE FOR CARRYING OUT THE INVENTION

Figure 1:
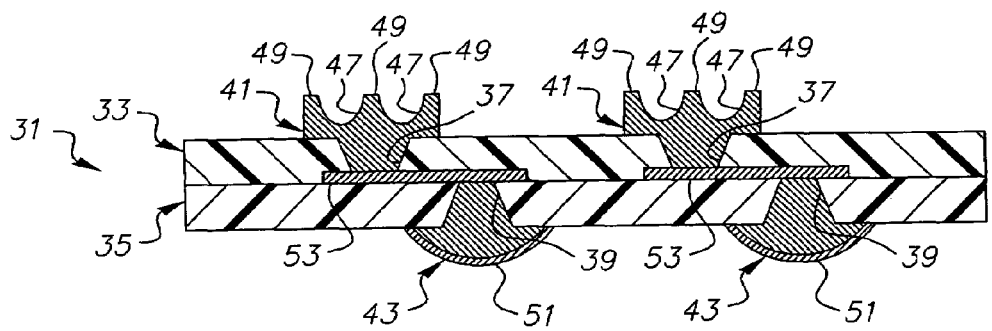
FIG. 1 is a much enlarged elevational view, in section, of an interposer according to one aspect of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "interposer" as used herein is meant to include a structure capable of electrically interconnecting two opposed, spaced arrays of electrical contacts (conductors) found on such electrical components as test apparatus and the like, and those on electrical devices such as semiconductor chips, chip carriers or the like. This is not meant to limit the invention, however, as the interposers formed in accordance with the teachings herein may be used for other interconnecting means, including, e.g., as a singular circuitized substrate to form an interconnection between two corresponding circuitized substrates such as a chip carrier and a printed circuit board (PCB). One such name for the invention may thus be a thin, flexible interposer. Typically, but certainly not limiting of the invention's capabilities, the contacts on a test apparatus may be of substantially planar pad configuration, while those used on semiconductor chips (or even chip carriers if being tested) may be solder balls of the small dimensions cited above. As defined herein, the invention is capable of interconnecting different types and shapes of electrical conductors, and is thus not limited to the types and shape mentioned immediately above. Such an interposer, as defined herein, includes at least two separate dielectric layers (prior to bonding together) and at least one interim conductor layer including a plurality of conductors, the conductors designed for interconnecting, electrically, metallic contacts located within spaced openings in the two dielectric layers. Examples of dielectric materials include such materials as fiberglass-reinforced epoxy resins (some referred to as "FR-4" dielectric materials in the art), polytetrafluoroethylene (Teflon), polyimides, polyamides, cyanate resins, polyphenylene ether resins, liquid crystal polymers, photo-imageable materials, and other like materials. The interim conductors and the metal for the metallic conductors used within the interposer are preferably of an excellent conductor such as copper, but other metals (e.g., nickel and gold) may then be added as well, for finish and/or enhanced conductivity purposes. Further examples will be described in greater detail herein-below. If the dielectric materials for the structure are of a photo-imageable material, this material may be photo-imaged (or photo-patterned), and developed to reveal the desired pattern of openings. The dielectric material may be curtain-coated, spin-coated or screen-applied, or it may be supplied as dry film. Final cure of the photo-imageable material provides a toughened base of dielectric. An example of a specific photo-imageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethyl-violet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 0.5 mils to about 4 mils thick, but may be thicker if desired.

By the term "sculpted" as used herein is meant a final external configuration of a metallic contact formed by differential gray scale etching, as described in U.S. Pat. No. 6,156,484, cited above, in which various designated surface areas are etched at different rates) to form the final, different final external configuration, or by forming a first external configuration (e.g., boxlike or cylindrical) which is then subjected to further processing (e.g., by gray scale etching, plating of dendritic structures, etc.). "Sculpted" is not meant to be "domed" (see below). The final configuration will typically include grooves, slots or similar indentations therein. This contact, as understood from the following, is capable of penetrating, albeit perhaps only partially, the surface of a contact such as a solder ball.

By the term "domed" as used herein is meant a final external shape of a metallic contact which is substantially rounded, with a relatively smooth external surface. Such a surface may include one or more relatively thin layers of conductive metal thereon.

In FIG. 1, there is shown an interposer 31 according to one aspect of the invention. Interposer 31 includes two dielectric layers 33 and 35, of a material such as defined above. As stated, each layer 33 and 35 has a thickness of from about 0.0005 inch to about 0.004 inch, but may be thicker if desired. Within each layer is a plurality of openings 37 and 39 respectively, preferably formed using a laser (e.g., a frequency-tripled Nd:YAG laser). As mentioned, such openings may be formed by suitable exposure and development processing if the dielectric layers are formed of a photo-imageable material. In a preferred embodiment, each opening is of the substantially tapered configuration depicted in FIG. 1, with a lower (bottom) diameter of about 0.0016 inch and an upper (top) external diameter of about 0.0025 inch. Significantly, the openings in one layer are offset from those in the adjacent, bonded layer. In one example, a total of 2000 openings are formed within each layer, with an offset for each associated pair (explained in greater detail below) of from about 0.004 inch to about 0.007 inch. This close, highly dense array is an example of the compactness and extremely small size of the instant invention. Each of the openings 37 and 39 include therein a metallic contact, these represented by the numerals 41 and 43, respectively. In the embodiment shown in FIG. 1, the upper contacts 41 are of the "sculpted" type while those in the lower dielectric layer 35 are of the "domed" type. Further explanation of how these are formed is provided below. It is seen that the upper contacts 41 include two or more channels, slots, or grooves 47 therein, resulting in the formation of a plurality of upstanding projections 49. In one embodiment, the upper contacts in FIG. 1 may assume the configuration depicted in FIG. 5 of U.S. Pat. No. 6,156,484, cited above, wherein a single groove surrounds a substantially centrally located upstanding projection. In contrast to the upper contact configurations, the lower domed contacts 43 include the rounded, relatively smooth external shape, with, in the embodiment of FIG. 1, at least one thin layer 51 (e.g., nickel and/or gold) thereon. As stated below, the sculpted pads may be coated with additional metallurgy, such as with layers of nickel and gold.

As clearly seen in FIG. 1 (and in FIG. 13), these metallic contacts project or protrude above the corresponding external surface of the dielectric layer in which each are positioned. In a preferred embodiment, contacts 41 and 43 protruded a distance of from about 0.0005 inch to about 0.002 inch above the respective external surface. Interconnecting respective opposing pairs of metallic contacts are a plurality of conductors 53. In a preferred embodiment, these are substantially planar metallic (e.g., copper) members, each of a thickness of only about 0.0005 inch. To provide the interconnection, each conductor (of a rectangular shape if viewed from above or below the interposer) has a length within the range of about 0.005 inch to about 0.008 inch.

Figure 2:
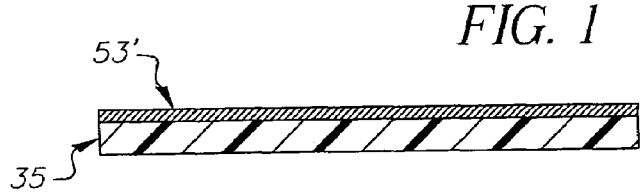
FIGS. 2-12 are elevational views, in section and on a reduced scale over the view of FIG. 1, representing the various steps used to make the interposer of FIG. 1, according to one aspect of the invention.

FIGS. 2-12 illustrate the steps of forming the interposer of FIG. 1 in accordance with one aspect of this invention. In FIG. 2, the first, lower (or bottom) dielectric layer 35 (e.g., of polyimide having a thickness of 0.001 inch) is provided, and a conductor layer 53' bonded thereto (e.g., using conventional lamination processing). It is understood that layer 53' is to be eventually processed to form the several individual conductors 53.

Figure 3:
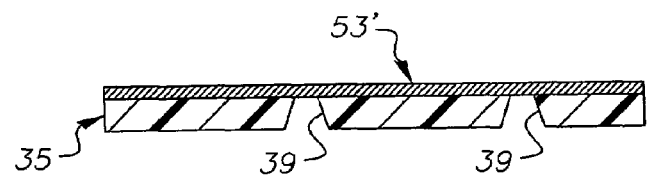
Figure 4:
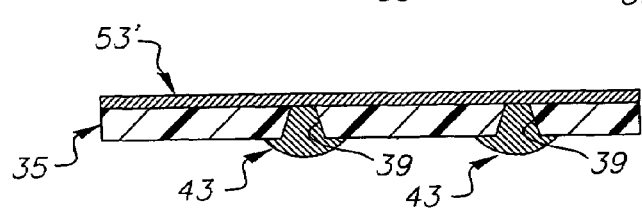
Figure 5:
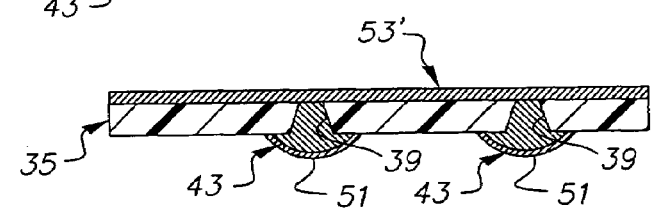

In FIG. 3, openings 39 are formed within layer 35, preferably using a laser. Alternatively, mechanical means such as a drill may be used. A laser is preferably used, with the bonded metal layer 53' determining the opening depth, an advantageous feature afforded by the use of the two-layered structure shown. In FIG. 4, metallic contacts 43 are formed, preferably using an electro-plating process. Examples of various electro-plating processes are known in the art, and are adaptable to forming the contacts of this invention. In this process, each opening 39 is filled with the desired metal (e.g., copper) to the extent that the domed, protruding external surface is formed, as shown. As also seen, the protruding portion includes segments which extend beyond the upper diameter of the opening, onto the external surface of layer 35. In FIG. 5, at least one "finish" layer 51 is plated onto the domed external surface, this layer preferably nickel or gold or an alloy of both metals. Alternative plating materials may include silver and platinum.

Figure 6:
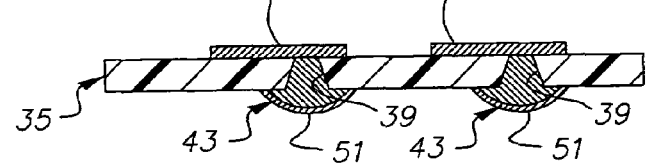
Figure 7:
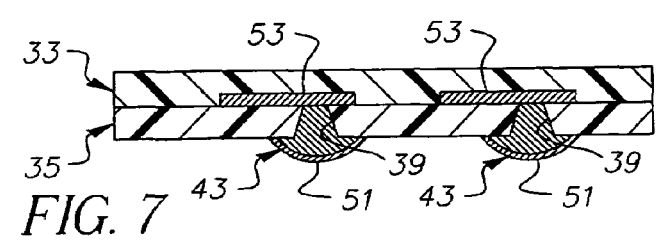

In FIG. 6, conductor layer 53' is subjected to an etching step in which the individual conductors 53 are formed on the upper surface of layer 35. Preferably, an etchant comprised of cupric or ferric chloride is used. In this step, layer 53' is coated with a layer of photo-resist having a thickness of about 2.5 microns. After baking per the recommended conditions of the manufacturer of the photo-resist, the photoresist is exposed to ultraviolet light through a photo-mask. The photo-mask is aligned to the part such that the pattern of conductor segments defined by the mask is aligned in relation to the vias 39 in the first dielectric layer 35. The photo-resist is then developed such that the photo-resist is removed in all areas where layer 53' is to be etched. Using a suitable etchant, layer 53' is removed in the exposed areas, for example, by exposing to a spray of cupric chloride solution. The photo-resist that covers the un-etched areas of layer 53' is then removed using a suitable resist stripping solution. In FIG. 7, the upper dielectric layer 33 is now added, preferably bonded to the underlying layer (and over the formed conductors 53) using conventional lamination processing, or applied using other conventional film deposition processes such as application and curing of liquid polymer resin.

Figure 8:
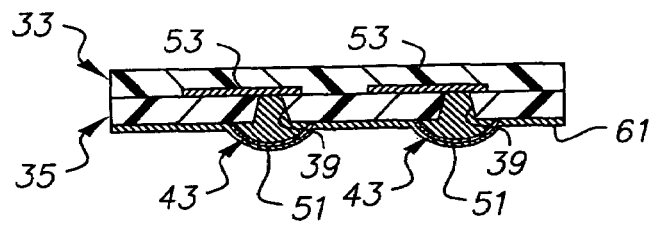

The next steps are considered relatively significant with respect to forming the interposer taught herein. In FIG. 8, a "commoning", thin metallic layer 61 (e.g., copper) is sputter deposited onto the lower external surface of bottom layer 35, including over the domed external surfaces of contacts 43.

During this step, one micron of copper is deposited onto layer 35 and the domed surfaces using a DC planar magnatron sputtering system. Argon is used as the sputtering gas.

Figure 9:
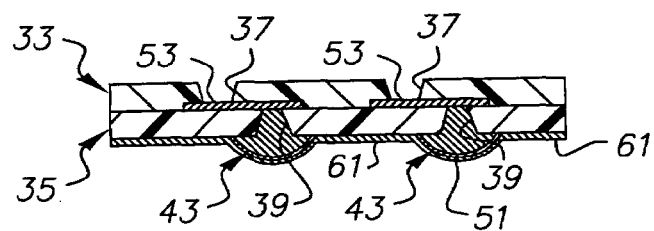
Figure 10:
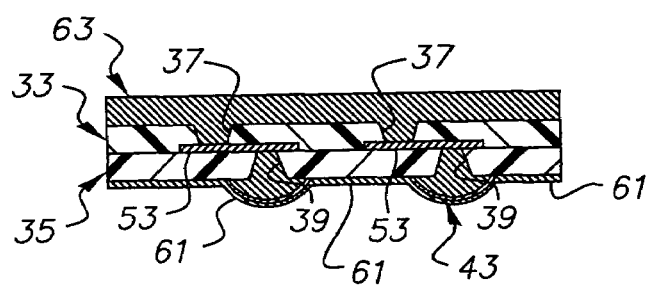

In FIG. 9, upper openings 37 are formed, preferably in the same manner as openings 39. Again, the metal layer now represented by the individual conductors 53 serves to limit the laser ablation to the desired opening depth, as occurred with respect to the formation of openings 39, albeit the layer was a single metal layer during this earlier opening formation and not individual conductors as in FIG. 9. In FIG. 10, an upper metallic layer 63 (e.g., copper), having a thickness of from about 0.0005 inch to about 0.002 inch (relative to the top surface of dielectric 33), is electroplated onto the upper surface of layer 33, and within openings 37, to the extent that these openings are substantially filled with the metal and a solid, integral layer 63 results. Such filling results in the opening metal being physically joined to the underlying conductor, forming the first stage of a paired conductor relationship for the interposer. Significantly, the commoning layer 61 provides the current path up through the lower contacts 43 and the interim conductors 58 to enable the electroplating process to occur. A seed and plate process is also possible if suitable hole fill chemistries are utilized.

Copper plating parameters are shown in TABLE A below. The copper is plated as solution is agitated perpendicular to the openings (knife edge agitation) to create a uniform wash over the panel surface, thereby mitigating the effects of increased flow around panel edges and eddy current flows in openings normally associated with agitation in parallel with such openings.

TABLE A

Copper Plating Parameters.

| Copper Plating Solution | Acid Copper Sulfate Bath |
|---|---|
| Brightener Level | 5-8 mL/L |
| Knife Edge Panel Agitation | 50 to 60 strokes per minutes with total movement 5 inches right and left of center axis |
| Current Density | 25 ASF |
| Plating Time | Approx. 60 minutes, depending upon array density and pattern size |

Figure 11:
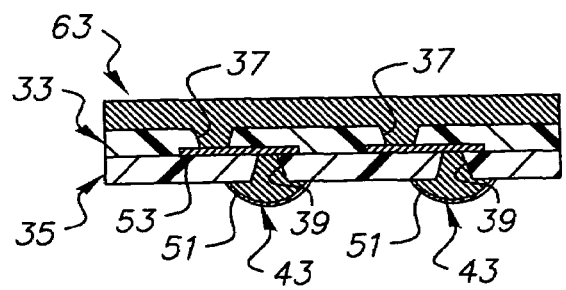
Figure 12:
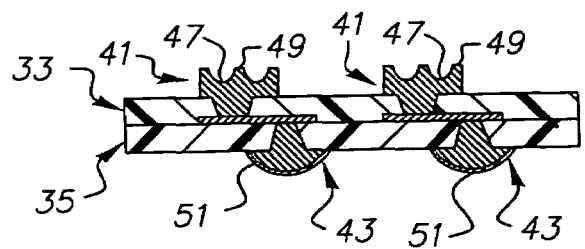

In FIG. 11, layer 61 is removed, preferably using an etchant such as used above in FIG. 6, and, in FIG. 12, the upper integral layer is gray scale differentially etched using a similar etchant as described above, to result in the formation of "sculpted" contacts 41 as shown.

In this process, the individual contacts are formed preferably by the aforementioned differential gray scale etching process (as described in U.S. Pat. No. 6,156,484, cited above) in which selected surfaces are etched at different rates to form a final external configuration having a desired number of grooves 47 or the like within the contact's upper surface, including only a singular continuous groove as in FIG. 5 of U.S. Pat. No. 6,156,484. In one embodiment, it is preferred to provide an additional thin coating of a sound conductive material onto the exposed surfaces of the formed contacts, including within any grooves such as grooves 47. In a preferred embodiment, a thin strike of nickel is plated over the surfaces, followed by a thin strike of gold. The final configuration as shown in FIG. 12 is substantially the same as the FIG. 1 embodiment.

Figure 13:
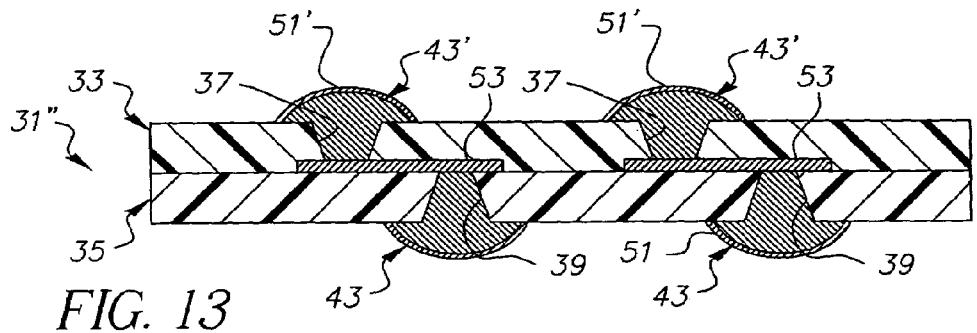
FIG. 13 is a much enlarged elevational view, in section, of an interposer according to another aspect of the invention.
Figure 14:
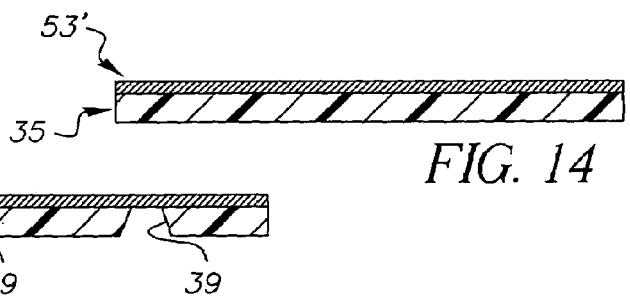
FIGS. 14-24 are elevational views, in section and on a reduced scale over the view of FIG. 13, representing the various steps used to make the interposer of FIG. 13, according to one aspect of the invention.
Figure 15:
Figure 16:
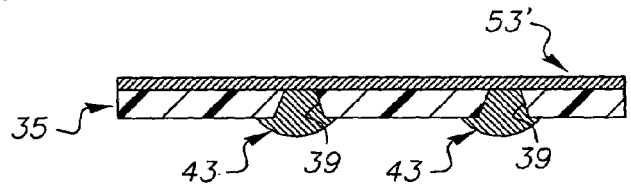
Figure 17:
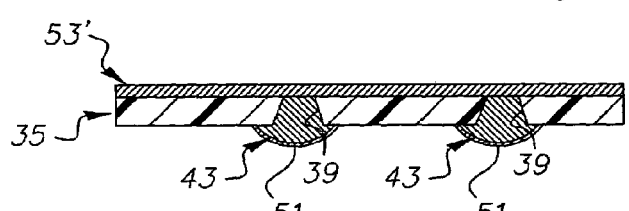
Figure 18:
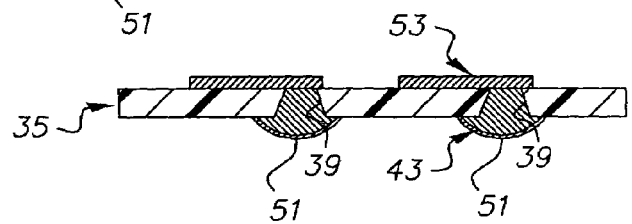
Figure 19:
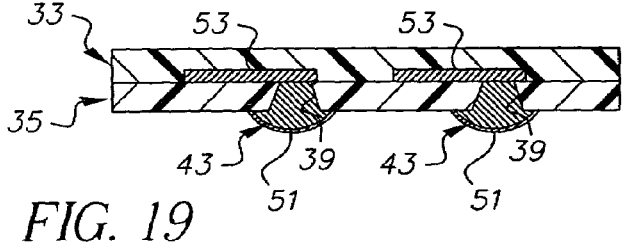
Figure 20:
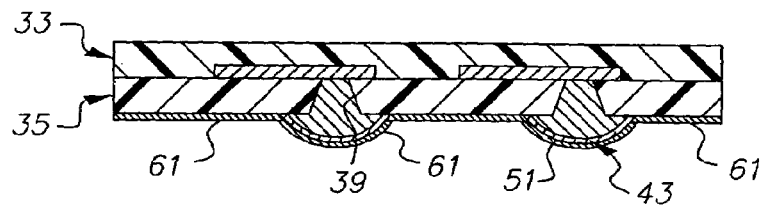
Figure 21:
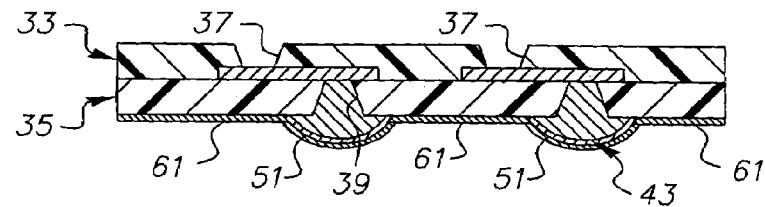
Figure 22:
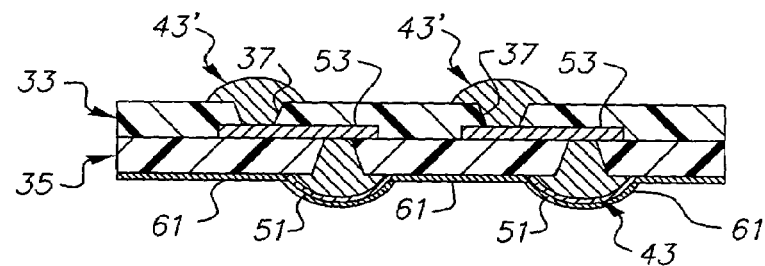
Figure 23:
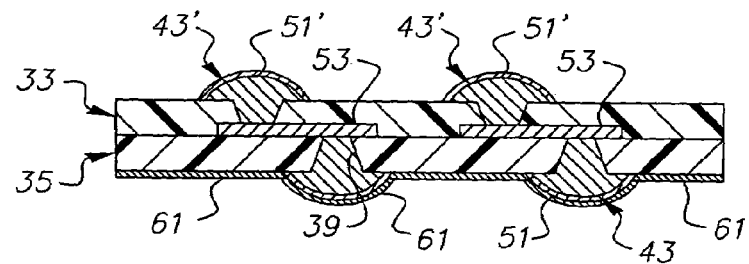
Figure 24:
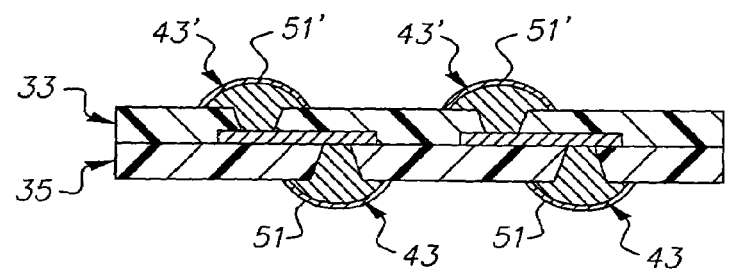

In FIG. 13, there is shown an interposer 31' formed in substantially the same manner as interposer 31 in FIG. 1, except for the formation of opposing contacts of domed type. The steps of FIGS. 14-21 are similar to those of FIGS. 2-9, and further description is not deemed necessary. In FIG. 22, a similar, solid, integral layer (not shown) is formed, using the provided commoning layer 61, but in the following etching step(s), the illustrated domed contacts 43' result, rather than the sculpted contacts 41 shown above. In FIG. 23, the contacts 43' are next plated with a layer 51', preferably similar to layer 51 formed on the lower contacts. Significantly, the commoning layer 61 is used here again (a second time) to provide the plating current path up through the lower contacts 43 and coupling conductors 53. In FIG. 24, the commoning layer 61 is removed, again preferably using an etchant as above, with the structure of FIG. 24 substantially the same as in FIG. 13 resulting.

Figure 25:
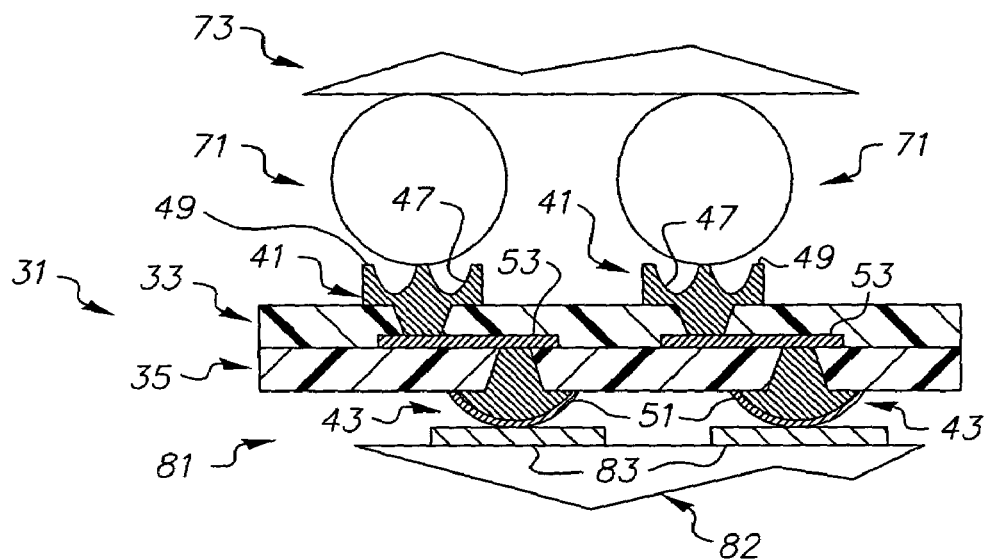
FIGS. 25 and 26 are much enlarged elevational views, in section, showing the interposers of FIGS. 1 and 13, respectively, interconnecting electrical contacts such as those found on a test apparatus and those of an electrical component such as a semiconductor chip.
Figure 26:
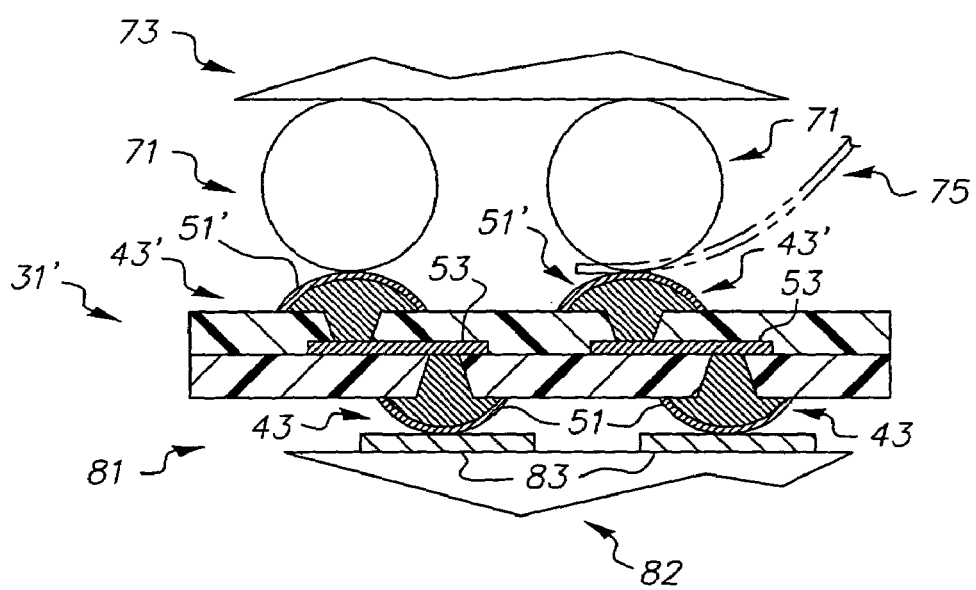

FIGS. 25 and 26 illustrate the embodiments of FIGS. 1 and 13, respectively, shown as being used to interconnect contacts 71 (e.g., solder balls) on the undersurface of an electrical device 73, which, in a preferred embodiment, is a semiconductor chip. Use of solder balls as contacts for chips is known in the art, as explained above. As further explained, such solder contacts, being of such small size and close proximity to one another in the dense patterns required for such devices today, present a formidable test to one desiring to test same (e.g., continuity testing). As defined, the interposer herein is able to do so in an expeditious manner such that, significantly, reduced "probe force" is used, compared to the forces required in some test apparatus of the prior art. Although the embodiment of FIG. 26 is shown coupling solder balls 71, this embodiment is also adapted for coupling to wire-bond chip pads using conventional wire-bonding processes, such wire-bond pads typically each comprising a flat metal (e.g., aluminum) pad. An example of such a wire (shown by the numeral 75, in phantom) is provided for illustration purposes in FIG. 26. The sculpted contacts 41 of FIG. 25 are of sufficient hardness greater than the metallurgy of the solder balls 71 such that these contacts will penetrate the solder balls during testing, preferably only partially and without destructive impact on the ball configuration. The contact will leave an imprint in the solder that disappears after solder reflow at a temperature above the melting point of the solder. This is described in U.S. Pat. No. 5,207,585. Accordingly, the interposers taught herein permit subsequent separation of the chip solder contacts such that said contacts will then remain as the chip's contacts, providing a non-destructive means of testing such chips. Such penetration is not shown in FIG. 25.

In a preferred embodiment, chips 73 are electrically coupled to contacts (conductors) of a test apparatus 81, some examples of which are known in the art. In one such example, the test apparatus will include what is referred to as a "space transformer" 82 with the thin, flexible interposer stretched over a pedestal located on the external surface of this transformer. The "space transformer" is in turn electrically coupled to a substrate such as a printed circuit board, which also forms part of the test apparatus. The "space transformer" thus serves to translate the chip's higher density pattern of contacts to the less dense, wider spaced array of contacts on the PCB. In one embodiment, this structure may comprise a multi-layered ceramic (MLC) component including a plurality of ceramic and conductive layers stacked together in a predetermined manner, the conductive layers interconnecting one another in a desired pattern to reach the corresponding pad conductors of the PCB. The contacts (conductors) of the "space transformer", represented by the numeral 83, are typically flat (planar) metal pads, such as shown in FIGS. 25 and 26.

Figure 27:
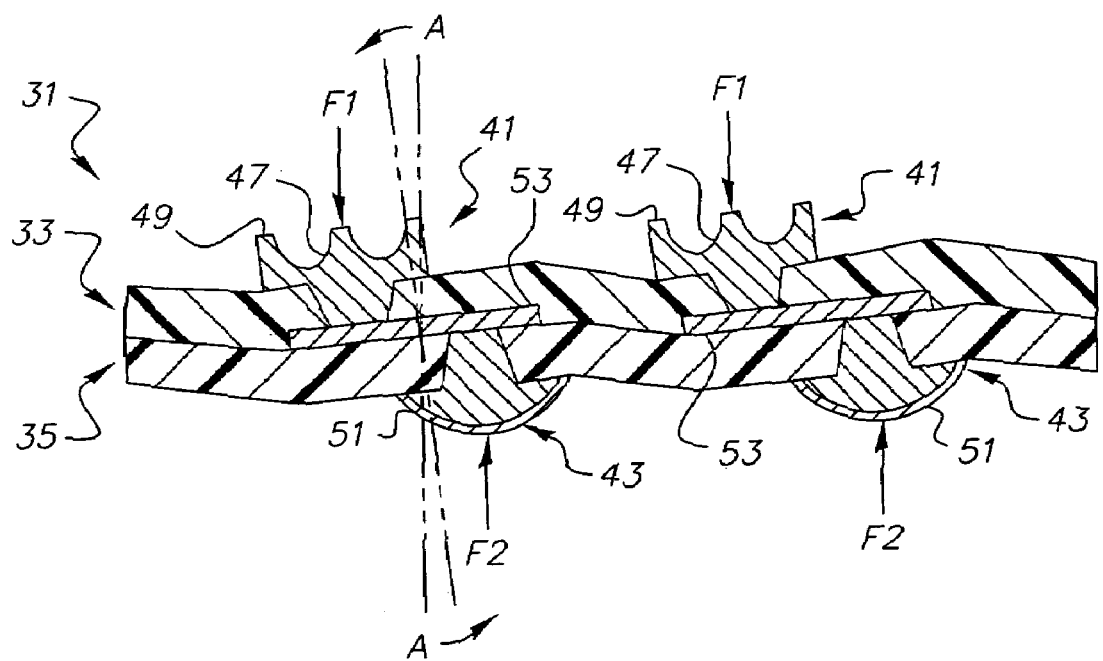
FIG. 27 is a much enlarged elevational view, in section, illustrating the tilting ability of the interposer of the invention when subjected to offsetting loads as occur during testing of electrical components such as those defined herein.

A significant feature of the present invention is the capability of the thin interposer to effectively provide the needed interconnects with a reduced contacting force, also often referred to as the above-mentioned "probe insertion force." To accomplish this, the interposer possesses the unique ability to "tilt" at the respective paired contact locations. One example of such "tilting" is shown in FIG. 27. As seen, the substantially vertically downward force F1 applied onto contacts 41 is opposed by the substantially vertically upward force F2 applied against the lower contacts 43. Should such opposing forces reach what might be considered an excessive level, the interposer "tilts" at each paired location so affected (understandably such disparity of force application may not occur across the entire width of the interposer), possibly at an angle A within the range of from about zero degrees to about ten degrees for an interposer having the dimensions described above. Such tilting compensates for any excessive forces to thus assure a sound, effective series of interconnections at an acceptable lower force (or forces). This ability for a dual dielectric, bonded layered structure including interim conductors is deemed entirely unobvious to those of ordinary skill in the art of such testing, considering the known structures such as those mentioned herein-above. In the FIG. 27 embodiment, it is also possible for the thin conductor(s) 53 to also flex somewhat, albeit not shown. Such conductor flexing adds even further compensation for excessive force application. One additional advantage is that the size of the pads and solder balls can remain very small and still achieve a relatively large offset. Yet another important advantage of this design is that it will compensate for deviations in coplanarity for contact points on the semiconductor chip and/or space transformer (if used).

There has thus been shown and defined an interposer for use with, among other structures, a test apparatus for the testing of electrical devices such as semiconductor chips having relatively high density solder or the like contact arrays. If used with such a test apparatus, the invention is capable of providing such interconnection between the chip and tester without causing deformation or destruction of chip. The interposer defined herein can be produced using, for the most part, conventional PCB processes such as electro-plating, lamination, and hole (opening) formation.

While there have been shown and described what are at present the preferred embodiments of the invention, it will be obvious to those skilled in the art that various changes and modifications may be made therein without departing from the scope of the invention as defined by the appended claims.

What is claimed is:

1. An interposer comprising:
   a first dielectric layer including a plurality of openings therein;
   a first plurality of metallic contacts located within said plurality of openings within said first dielectric layer, selected ones of said first plurality of metallic contacts including a protruding portion protruding from said first dielectric layer;
   a second dielectric layer bonded to said first dielectric layer and including a plurality of openings therein;
   a second plurality of metallic contacts located within said plurality of openings within said second dielectric layer, selected ones of said second plurality of metallic contacts including a protruding portion protruding from said second dielectric layer in an opposing direction from said selected ones of said first plurality of metallic contacts protruding from said first dielectric layer, each of said selected ones of said first plurality of metallic contacts being positioned in an offsetting relationship with respect to a corresponding one of said selected ones of said second plurality of metallic contacts to form a paired contact location; and
   a plurality of electrical conductors positioned substantially between said first and second dielectric layers, each of said electrical conductors electrically connecting selected ones of said first plurality of metallic contacts with respective ones of said selected ones of said second plurality of metallic contacts, said interposer, including said first and second dielectric layers, said first and second plurality of metallic contacts and said plurality of electrical conductors, being adapted for tilting at each of said paired contact locations of said first and second metallic contacts in response to the application of forces on said first and second metallic contacts at said paired locations to compensate for the application of said forces in an excessive manner.

2. The interposer of claim 1 wherein each of said first and second plurality of metallic contacts is comprised of copper.

3. The interposer of claim 1 wherein selected ones of said second plurality of metallic contacts include a sculpted configuration.

4. The interposer of claim 1 wherein selected ones of said first plurality of metallic contacts include a domed portion.

5. The interposer of claim 1 wherein said selected ones of said first plurality of metallic contacts include a first conductive plating thereon.

6. The interposer of claim 5 wherein said selected ones of said first plurality of metallic contacts include a second conductive plating substantially over said first conductive plating.

7. The interposer of claim 1 wherein selected ones of said first plurality of metallic contacts include a sculpted configuration and selected ones of said second plurality of metallic contacts include a domed configuration.

8. The interposer of claim 1 wherein selected ones of both said first and second plurality of metallic contacts include a domed configuration.

9. The invention of claim 1 wherein said interposer is adapted for use as part of a test apparatus for testing semiconductor chips having a plurality of contacts thereon, said first plurality of metallic contacts located within said plurality of openings within said first dielectric layer being adapted for engaging respective ones of said plurality of contacts on said semiconductor chip.

* * * * *